United States Patent [19]

Ohmi

[11] Patent Number: 5,272,417
[45] Date of Patent: * Dec. 21, 1993

[54] DEVICE FOR PLASMA PROCESS

[76] Inventor: Tadahiro Ohmi, 1-17-301, Komegabukuro 2-chome, Aoba-ku, Sendai-shi, Miyagi-ken 980, Japan

[*] Notice: The portion of the term of this patent subsequent to May 5, 2009 has been disclaimed.

[21] Appl. No.: 612,192

[22] Filed: Nov. 13, 1990

Related U.S. Application Data

[63] Continuation-in-part of Ser. No. 602,225, Jan. 7, 1991.

[30] Foreign Application Priority Data

May 12, 1989 [JP] Japan .................. 1-119651

[51] Int. Cl.$^5$ .................. H05H 1/46; C23F 4/00
[52] U.S. Cl. .................. 315/111.21; 204/298.34; 204/298.35; 204/298.32; 156/345; 156/643
[58] Field of Search ............ 315/111.21; 204/192.34, 204/192.32, 192.38, 298.12, 298.01, 298.02, 298.31, 298.41; 156/345, 627; 118/50.1, 716, 620, 715

[56] References Cited

U.S. PATENT DOCUMENTS

| 4,464,223 | 8/1984 | Gorin | 204/192.32 |
| 4,491,496 | 1/1985 | Laporte et al. | 204/298.31 |
| 5,110,438 | 5/1992 | Ohmi et al. | 204/192.32 |

FOREIGN PATENT DOCUMENTS 1-180970 7/1989 Japan .................. 315/111.21

Primary Examiner—Robert J. Pascal
Assistant Examiner—Michael B. Shingleton
Attorney, Agent, or Firm—Baker & Daniels

[57] ABSTRACT

A plasma process device for a generating a plasma in a container under reduced pressure and for processing an object. First and second electrodes are placed in opposed positions in the container. The electrodes are plate-like in shape. A protective member made of a stable material covers the first electrode. A means is provided for mounting the object to be processed on the second electrode. A first high-frequency power source is connected to the first electrode. A second high-frequency power source is connected to the second electrode. A gas supply for introducing desired gas into the container is provided. Frequency of the first high-frequency power source is higher than the frequency of the second high-frequency power source.

3 Claims, 11 Drawing Sheets

DEVICE FOR PLASMA PROCESS

BACKGROUND OF THE INVENTION

This application is a continuation-in-part of U.S. Application Ser. No. 07/602,225 filed Jan. 7, 1991 entitled REACTIVE ION ETCHING DEVICE filed on even date herewith.

The present invention relates to a device to be used for various plasma processes, such as reactive ion etching (RIE), plasma chemical vapor deposition (PCVD), etc.

In recent years, a number of new devices and techniques have been developed, by which plasma is generated in a container under reduced pressure to perform various processes at low temperature on materials such as the substrate of an integrated circuit in the plasma atmosphere. For example, there is an RIE (reactive ion etching) method for etching various types of thin film of integrated circuits (conductive film such as Al, W, Ta, etc., semiconductor thin film such as poly-Si, Si, etc., or insulating thin film such as $SiO_2$, $Si_3N_4$, $Al_2O_3$, etc.) providing them with an anisotropic property, or there is PCVD film forming method, by which $Al(CH_3)_3$, $AlH(CH_3)_2$, etc. are used as raw material gases, and these are decomposed to $Al(CH_3)_2$ or $Al(CH_3)$ and adsorbed on a substrate and aluminum is then deposited by surface reaction.

In the above RIE method, the gas to generate the excited activation seed, e.g. $CF_4F_2$, $CCl_4$, $Cl_2$, $CF_2Cl_2$, etc. (hereinafter referred as "excited activation seed source gas") is introduced in a vacuum container. Then, DC or high frequency power is applied on a susceptor which holds the base substrate, and glow discharge is induced to generate plasma. The ions generated in the plasma and the excited activation seed are simultaneously applied to the surface to be etched, and etching is performed physically and chemically. It is possible by this method to perform anisotropic etching by maintaining a high selection ratio to the photoresist, which is a mask material.

In the glow discharge by high frequency input, the surface of the base substrate is biased to negative in terms of DC to plasma (this is called "self-bias"). The ions are accelerated by the potential based on the difference between the self-bias voltage and the plasma potential, and they collide with the surface of the base substrate. Thus, the surface of the substrate is etched by the action with the excited activation seed, which is adsorbed on the surface of base substrate.

FIG. 5 schematically shows cross-sectional structure of a conventional type typical reactive ion etching device. 503 is a base substrate having the surface to be etched, e.g. semiconductor wafer or base substrate made of glass, quartz, metal, etc. 504 is a susceptor electrode. High frequency power is supplied to the susceptor electrode 504 through a matching circuit, and the vacuum container (chamber) 505 is normally grounded for safety purpose. Here, a high frequency power source (RF power source) is normally used with an output frequency of 13.56 MHz. In many cases, plate-like electrodes are placed at opposed positions above the susceptor electrode 504.

In addition to the above arrangement, there are also provided an exhaust unit for pumping the vacuum container to a vacuum condition and for gas exhaust, an inlet for introducing gas into the vacuum container 505, and a mechanism for removal and insertion of base substrate 503, whereas these are not shown in the figures to simplify explanation.

On the base substrate 503 such as semiconductor wafer or on the surface of the susceptor electrode 504, negative self-bias is applied in terms of DC to plasma because of RF power applied on the susceptor electrode 504, and the ions accelerated by this voltage exert action on the surface of the base substrate and enhances surface reaction. Thus, the surface of the base substrate is etched.

To increase the etching speed in the above RIE device, it is necessary to have higher plasma density by raising high frequency power.

In a conventional type device, however, self-bias of the electrode is increased when high frequency power is raised, and plasma potential is also increased. As the result, ions having high energy accelerated by the voltage caused by the difference between this big self-bias and plasma potential are irradiated on the substrate. Therefore, the following problems occur:

(1) When irradiation ion energy is increased, resist is also etched. This results in a change of pattern dimension. As the result, fine fabrication cannot be accurately performed. Particularly, such phenomenon will appear especially in the future type highly integrated elements wherein the thickness of resist is about 0.5 μm or less.

(2) Because the ions having high energy are irradiated, the underlying materials are damaged, and this leads to the decrease of the performance characteristics and reliability of the elements composed of these materials. Above all, serious trouble may occur such as an increase of leakage current or a decrease of dielectric strength.

(3) Because plasma potential is normally turned to +50−100 V the ions collide with the inner surface of the chamber. By the collision of the ions with high energy, the inner surface of the chamber is sputtered, and the surface of the base substrate is stained with chamber materials, e.g. Fe, Ni, Cr, Cu, etc. This is the contamination of the substrate surface by the chamber materials caused by the collision of ions with high energy. When the substrate surface is contaminated with such heavy metals, defects may occur on the substrate surface in the subsequent high temperature process or leakage current may increase. This severely deteriorates the characteristics of the device.

In the conventional type device, the frequency of 13.56 MHz is used as the frequency of the high frequency power source. When the plasma excitation frequency is as low as 13.56 MHz, the DC self-bias generated on the electrode is negative and high even when gas pressure in the chamber and the high frequency power are at constant level. FIG. 3 (a) shows current-voltage characteristics when the gap between the opposed electrodes is 3 cm, the diameter of the disk electrode is 10 cm, the argon gas pressure is $5 \times 10^{-3}$ Torr, and the high frequency power is 50 W. In this figure, DC negative voltage applied on the electrode is given on abscissa, and the current flowing to the electrode is given on ordinate. The fact that the current takes a negative value means that electrons flow to the electrode. When the current is positive, positive ions flow to the electrode. The negative voltage when the current is 0 corresponds to self-bias of the electrode. This is because high frequency power is normally supplied to the electrode through a capacitor, and DC current does not flow.

As it is evident from FIG. 3 (a), the self-bias of the electrode is −400 V, −260 V and −90 V respectively when the frequency of high frequency power supply is 14 MHz, 40.68 MHz and 100 MHz respectively. In other words, even when the electrode structure, gas pressure and electric power are maintained at a constant level, negative self-bias of the electrode is gradually decreased with the increase of frequency.

FIG. 3 (b) shows the details of such phenomenon. Namely, when the argon gas pressure is $7 \times 10^{-3}$ Torr, high frequency power is 100 W, electrode gap is 3 cm, and electrode diameter is 10 cm. This shows how self-bias of the electrode changes in case the frequency of the high frequency power supply for plasma excitation is changed from 10 MHz to 210 MHz. When the frequency is increased, the negative self-bias is rapidly decreased. Plasma potential is shown in FIG. 3 (b) at the same time, and this plasma potential is maintained at +20 V even when the frequency is changed to 10 MHz −210 MHz.

With the progress of LSI toward ultra-fine structure and ultra-high integration, the aspect ratio of the contact hole and the via hole gradually increases. That is, it is required to etch fine and deep holes with high controllability and reproducibility. It is necessary to set the gas pressure in the etching chamber to a low value (e.g. $10^{-3}$ Torr) and to elongate the average free path of the molecules. Even when the gas pressure is low, it is desirable that the frequency of discharge excitation is high in order to generate plasma with high concentration and to increase the throughput. However, it is not desirable that the wavelength of the discharge excitation frequency is shorter than the diameter of the susceptor electrode 504 because a discharge of a higher mode occurs and the plasma with uniform density is not excited in the electrode. As a result, uniform etching performance is not attainable.

In the conventional type device, it is not possible to independently and directly control plasma density, i.e. ion irradiation quantity and irradiation ion energy. Thus, the conditions such as pressure and flow rate of the excited activation seed source gas or high frequency power, etc. must be combined appropriately to achieve indirect control.

Further, in addition to the above RIE device, there are the other devices, by which processing can be performed without damaging the objects to be processed in plasma, such as PCVD device, $O_2$ plasma resist asher, dry cleaning device, etc. Although these devices are basically operated under common conditions, they have been independently designed and produced. At the same time, they have had the disadvantages of (1), (2) and (3) above.

The above problems have been found by the present inventor, who elaborately studied the problems and have finally found the means to solve them.

SUMMARY OF THE INVENTION

The object of the present invention is to offer a low-cost high-performance device for a plasma process, which is applicable to etching and film formation and has high productivity, and by which it is possible to perform substrate etching or to form film on a substrate without damaging or contaminating the substrate (base substrate) and which is applicable to etching or film formation by changing the gas to be introduced or plasma excitation frequency despite the fact that the chamber and the electrode have the same structure.

The device for the plasma process according to the present invention is to generate plasma between two opposed electrodes placed in a container wherein pressure can be reduced and to process the object to be processed in the plasma. It is a general purpose device applicable for various plasma processes and for high speed processing to avoid the above mentioned damage and surface contamination, characterized in that there are provided at least first and second electrodes placed at opposed positions in the container and formed in plate-like form. A protective member composed of stable material which is stable to the plasma is placed to cover the first electrode. A holding means for mounting the object to be processed is placed on the second electrode. A first high frequency power source is connected with the first electrode. A second high frequency power source is connected to the second electrode. A gas supply means is provided for introducing the gas as desired into the container. The frequency of the first high frequency power source is set higher than the frequency of the second high frequency power source.

For example, when the device is used as an RIE device, the object to be processed, e.g. the substrate, on which the thin film to be etched is formed, is mounted on the second electrode in the container. After the pressure in the container is reduced, chlorine type gas, fluorine type gas or a mixture of these gases are introduced according to each of the thin films by the gas supply means. Then, high frequency power of the first frequency (100–250 MHz) is supplied to the first electrode to generate a plasma between the electrodes, and high frequency power of the second frequency (10–50 MHz) is supplied to the second electrode to control the self-bias of the second electrode. Specifically, the density of the generated plasma or the quantity of ions irradiated on the substrate is controlled by the high frequency power of the first frequency supplied to the first electrode.

On the other hand, the energy of the ions irradiated on the substrate surface is controlled by the high frequency power of the second frequency supplied to the second electrode and by its self-bias. Because high frequency power supplied to the first electrode plays a role to generate plasma, its power is normally big. However, the negative self-bias of the first electrode can be sufficiently decreased because the frequency is set high. Therefore, the energy of the ions irradiated on the first electrode is small enough. Thus, the surface is not sputtered and the substrate surface is not contaminated. Negative self-bias induced on the substrate surface controls the energy of the ions irradiated on the substrate surface to optimal value, and the problems of damage and contamination does not occur.

In case it is used for PCVD device, the substrate, on which the deposited film is formed, is maintained on the second electrode. The ratio between the first frequency and the second frequency is set in the same manner as in the case of the RIE device, and the gases to be introduced into the container are: $SiH_4$, $SiH_2Cl_2$, $Si_2H_6$, etc. for the case of Si film and the mixed gas of $SiH_4$ and $O_2$ or $Si_2H_6$ and $O_2$ in case of $SiO_2$ film. In this case, the damage of the substrate can be avoided and the contamination of the object to be processed can be prevented by the same reasons as described for RIE.

Further, the present invention can also be applied to the resist asher, for which the damage and contamination of substrate surface are unavoidable according to the conventional technique. For example, the photoresist indispensable for fine pattern fabrication is detached in the wet process using mixture solution of $H_2SO_4$ and $H_2O_2$. When it is used as mask material for ion implantation, resist is hardened by the irradiation of high energy ions, and it is not detached by the normal wet process. For this reason, it is necessary to generate $O_3$ or O radial by using $O_2$ plasma and to remove the ion-implanted resist by utilizing ion energy.

In case it is applied to resist asher, as already described for RIE and PCVD devices, resist can be detached without damaging or contaminating the substrate surface if the substrate is furnished on the second electrode, and self-bias of the second electrode is controlled by high frequency power of the second frequency.

Thus, the present invention can be widely applied to the devices for various plasma processes with some modifications of the conditions to use.

BRIEF DESCRIPTION OF THE DRAWINGS

The above mentioned and other features and o this invention, and the manner of attaining them, will become more apparent and the invention itself will be better understood by reference to the following description of embodiments of the invention taken in conjunction with the accompanying drawings, wherein:

FIG. 1 (b) is a circuit diagram to show an example of the band eliminator of FIG. 1;

FIG. 1 (c) is a graph of resonance characteristics of band eliminator of FIG. 1 (b);

FIG. 1 (d) is a circuit diagram of another example of the band eliminator of FIG. 1 (b);

FIG. 1 (e) is a graph to show the change of potential of first and second electrodes in relation to high frequency power to the second electrode;

FIG. 3 (b) is a graph showing the change of self-bias voltage to the change of frequency;

FIG. 4 (b) is a schematic diagram of embodiment 3;

FIG. 4 (c) is a circuit diagram of another example of a band eliminator;

Figure 1A:
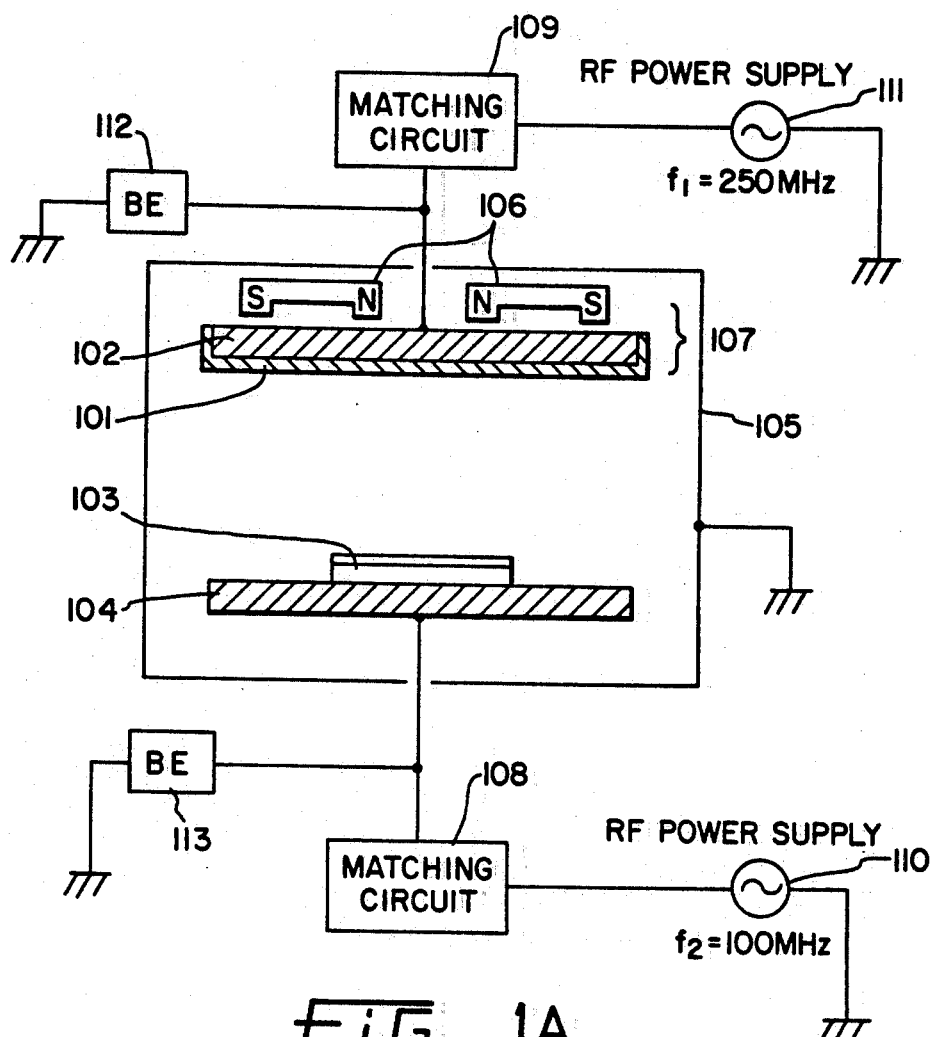
FIG. 1 (a) is a schematic diagram of a device showing the Embodiment 1 of this invention.
Figure 1B:
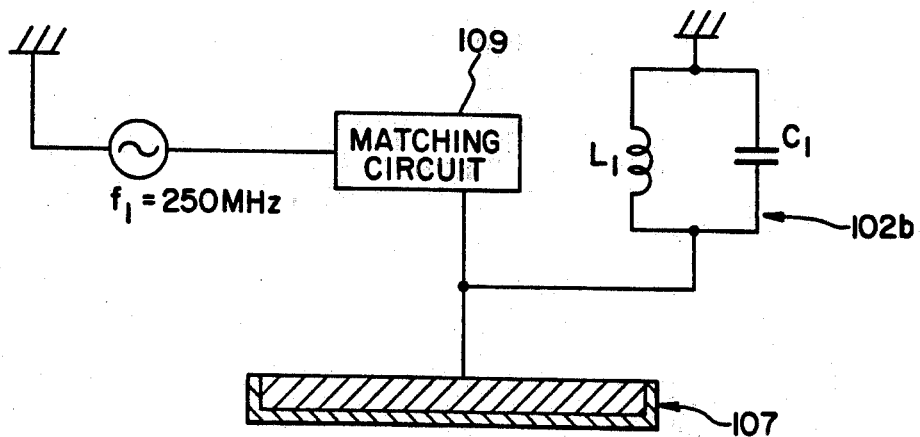
Figure 1C:
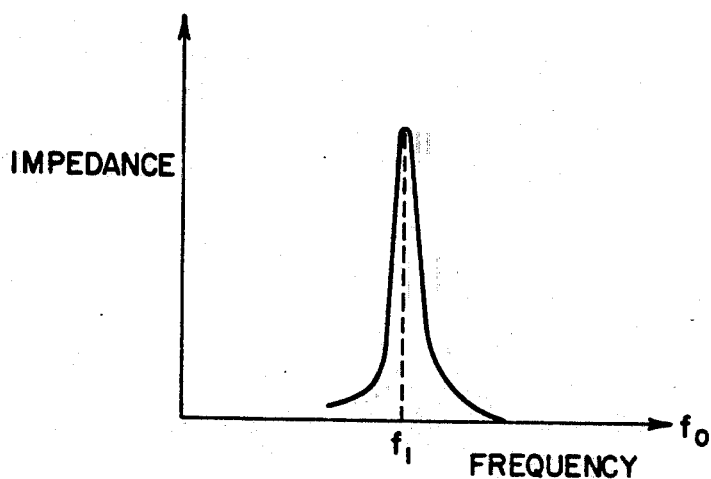
Figure 1D:
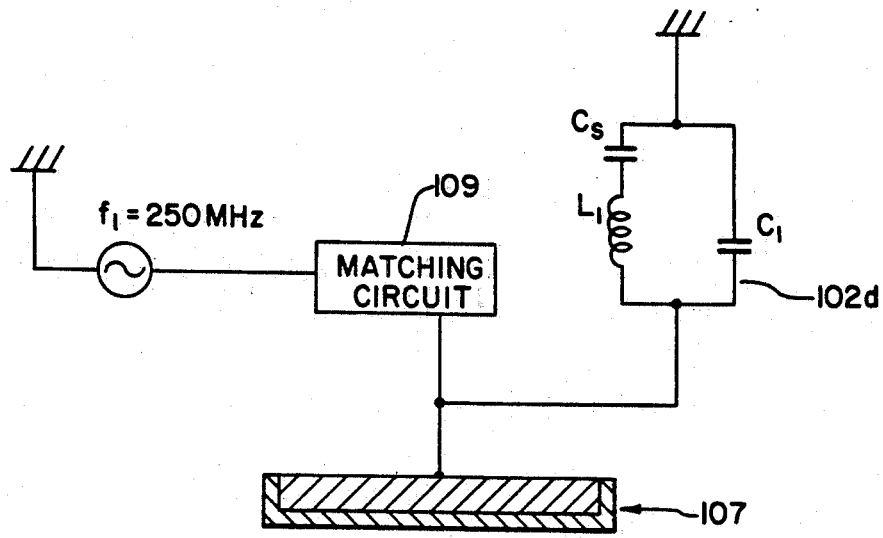

Corresponding reference characters indicate corresponding parts throughout the several views. The exemplifications set out herein illustrate a preferred embodiment of the invention, in one form thereof, and such exemplifications are not to be construed as limiting the scope of the invention in any manner.

DESCRIPTION OF THE PREFERRED EMBODIMENT

In the following, the embodiments of the present invention will be explained in connection with the drawings.

FIG. 1 (a) shows the first embodiment, in which the present invention is applied for RIE device to perform etching on a substrate surface. Here, description is given on the etching of thin film, which is formed on a semiconductor substrate.

In a vacuum container (chamber) 105, a plate-like electrode 107 above and a plate-like susceptor electrode 104 are placed at opposed positions, and the vacuum container 105 made of metal is connected to ground. The inner surface of the vacuum container 105 is covered with the material stable to the plasma of fluorine type or chlorine type corrosive gas, i.e. oxide film, nitride film or fluoride film, in order not to be corroded when exposed to the plasma. The electrode 107 is composed of a base material 102 made of electrically conductive material and a protective layer 101 serving as protective member made of $SiO_2$, $Si_3N_4$, $Al_2O_3$, AlN, etc. is formed on the surface of the base material 102.

The protective layer 101 is to prevent the etching of the base material 102 by the plasma generated by the discharge. For example, it is made of Si, $SiO_2$, quartz, SiC, $Si_3N_4$, $Al_2O_3$, AlN, etc. Or, it may be composed of passive state film made of fluoride, which satisfies approximate stoichiometry. This passive state film exhibits anti-etching properties, and it may be formed as follows: Base material (e.g. base material made of stainless steel, nickel, nickel alloy, aluminum alloy or other metal or alloy) is finished in mirror surface without the deteriorated layer due to fabrication by an electrolytic polishing technique. Then, it is baked at the predetermined temperature in a high-purity inert atmosphere, and the adsorbed moisture is removed. After baking, it is fluorinated at the predetermined temperature by high-purity fluorine. Then, it is processed by heat treatment at the temperature a little higher than the temperature of fluorination in a high-purity inert atmosphere. Thus, a passive state film satisfying approximate stoichiometry is formed on the base material. If the protective layer 101 is formed by Si, Si is contained in the substrate 103 on the susceptor electrode 104 even when the protective layer 101 is etched, and the influence on the substrate 103 can be minimized.

A high frequency power source 110 is connected through matching circuit 108 to the susceptor electrode 104 to provide high frequency power at a second frequency $f_2$. In this embodiment, high frequency power of 100 MHz is provided. For potential control of the susceptor electrode 104, the second frequency $f_2$ is preferably 10–50 MHz. High frequency power source 111 provides high frequency power to electrode 107 at a first frequency $f_1$ which is higher than the frequency $f_2$ which is supplied to the susceptor electrode 104. In this embodiment, high frequency power at 250 MHz is applied. It is desirable that the two frequencies $f_1$ and $f_2$ are not in the relation of multiple of an integer.

Further, on the electrode 107 and the susceptor electrode 104, band eliminators 112 and 113 are furnished in order that only the first high frequency (250 MHz in this example), and the second high frequency (100 MHz in this example) are provided respectively. Specifically, the first high frequency $f_1$ is short-circuited to ground on the susceptor electrode 104, and the second high frequency $f_2$ is short-circuited to ground on the electrode 102. The band eliminators 112 and 113 used on electrodes 107 and 104 are basically formed to have the arrangement as the tank circuit 102b of FIG. 1 (b). In the parallel circuits of $L_1$ and $C_1$, impedance reaches the maximum with the resonance frequency of $$f_1 = (\tfrac{1}{2}\pi \sqrt{L_1 C_1})$$

(FIG. 1 (c)), and they are short-circuited to the other frequencies. Thus, the high frequency of the predetermined frequency of $f_1 = 250$ MHz in this case) can be selected and supplied to the electrode.

The arrangement of FIG. 1 (b) as shown here represents only the basic principle, and it is needless to say that various modifications can be used for improvement. FIG. 1 (d) shows an example of such improvement.

Circuit 102b is grounded in terms of DC through the inductance $L_1$. If it is desired to leave this in floating state, a capacitor $C_s$ should be added, as at 102d of FIG. 1 (d) to cut off DC component. In this case, $C_s$ must take a large enough value to satisfy the condition:

$$f_1 \cdot L_1 >> 1/f_1 C_s$$

in order that the resonance frequency of the circuit 102d does not deviate from the frequency $f_1$.

In the case of a frequency $$f_0 = (\tfrac{1}{2}\pi \sqrt{L_1 C_S}),$$

the impedance is turned to 0 in the serial circuits of $L_1$ and $C_s$ and they are short-circuited to high frequency $f_0$. If this frequency $f_0$ is equalized to the frequency $f_2$ applied on susceptor electrode 104, it is possible to effectively prevent the overlapping of high frequency $f_2$ on the electrode 107. Even when the electric field of high frequency power entering the susceptor electrode 104 is terminated vertically from the susceptor electrode 104 to the electrode 107, the voltage on the electrode 107 does not fluctuate due to the electric power of frequency $f_2$ because the electrode 107 is short-circuited to ground for high frequency $f_2$.

In the above, description has been given on band eliminator 112. If the same arrangement is adopted for the band eliminator 113, the voltage of the susceptor electrode 104 is not fluctuated by the frequency $f_1$ supplied to the electrode 107. Specifically, in the circuit of FIG. 1 (d), it is supposed that the inductance $L_1$ is inductance $L_2$, capacitor $C_1$ is capacitor $C_2$, and capacitor $C_s$ is capacitor $C_{s2}$. Then;

$$f_2 = 1/(2\pi \sqrt{L_2 C_2})$$

$$f_2 L_2 >> 1/(f_2 C_{s2})$$

$$f_1 \; 1/(2\pi \sqrt{L_2 C_{S2}})$$

The discharge of the excited activation seed source gas introduced to the vacuum container 105 is performed by the high frequency $f_1$. Even when the electric power of frequency $f_1$ is increased to have higher ion density, no influence is exerted on the voltage of susceptor electrode 104.

The same applies to the high frequency power of $f_2$ supplied susceptor electrode 104 because the power of $f_2$ is short-circuited circuited to ground on electrode 107 even when the high frequency power of $f_2$ is changed.

One of such examples is given in FIG. 1 (e). In this figure, the DC self-bias of the first electrode and the second electrode is plotted when power is changed under the following conditions: The gap between the first electrode and the second electrode is 3 cm, the diameter is 10 cm, gas pressure is $7 \times 10^{-3}$ Torr, $f_1 = 100$ MHz, input power is maintained at constant level, and $f_2 = 30$, 40 and 50 MHz. The self-bias of the first electrode is about $-25$ V and is not influenced by the frequency and the power supplied to the second electrode. The potential of the second electrode is about 10 V when there is no high frequency input. With the increase of high frequency power of $f_2$, it is decreased linearly and is turned to negative voltage when the power exceeds a certain level. The lower the frequency $f_2$ is, the more the self-bias voltage to the same power alteration is changed. In any case, it is evident from FIG. 1 (e) that DC potential of the electrode (self-bias) can be controlled by high frequency power and its frequency without exerting influence on the potential of the opposing electrode.

By such arrangement, it is possible for electrode 107 and susceptor electrode 104 to effectively prevent the overlapping of high frequency to the partner electrode and to supply the high frequency to each of them. Thus, it is possible to control self-bias plasma density and energy of irradiated ions more easily and accurately.

By cylindrical magnet 106 mounted on the backside of the electrode 107, a nearly parallel magnetic field is generated on the surface of the electrode 107, and the electrons are wound on this magnetic field and make cyclotron movements. When a vertical high frequency electric field is present between the two electrodes 107 and 104, energy is effectively given to the electrons making cyclotron movements, and a high density plasma is effectively generated by high frequency power. In the present device, therefore, the two electric fields of high frequency power are set in such manner that they terminate nearly vertically to the susceptor electrode 104 and the electrode 107, respectively.

106 is a permanent magnet for magnetron discharge. Actually, it is preferable that an electromagnet of ferromagnetic material is used. Further, there are provided in the device an exhaust unit to pump the vacuum container 105 to vacuum condition, a mechanism to introduce gas, and a mechanism for removal and insertion of substrate 103, whereas these are not shown to simplify the explanation.

Unlike the conventional type equipment, the device in this embodiment is provided with the electrode 107 in addition to the susceptor electrode 104. Thus, it is possible to generate plasma of high density by supplying high frequency power source on the electrode 107 and etching can be performed at high speed. However, when a large amount of power at a high frequency is supplied to the electrode 107, self-bias is also increased, and it is very likely that the electrode may be affected by sputter-etching. To prevent such etching, it is necessary to increase the frequency $f_1$ of high frequency power source 111 supplied to the electrode 107 compared with the frequency $f_2$ and to decrease the self-bias. (When frequency is increased, self-bias is decreased. See FIG. 3 (b).). Also, it is necessary to furnish a protective layer 101 on the surface of the base material 102 of the electrode 107.

On the other hand, the self-bias generated on susceptor electrode 104 can be controlled by power and frequency of the high frequency power source 110 as shown in FIG. 1 (e). Therefore, it is desirable to select the power and frequency of high frequency power source 110 by taking the material of the thin film to be etched into account, and to supply them to the susceptor electrode 104.

After all, when the device of this embodiment is used, a high density plasma can be generated by high frequency power supplied to the electrode 107 (Plasma density, i.e. ion density is controlled by electric power.), and the energy of ions irradiated on the substrate surface can be controlled to the desired value by high frequency power of $f_2$ supplied to the susceptor electrode 104. Thus, it is possible to perform RIE at high speed while preventing damage to the substrate 103.

Next, description is given on the influence of high frequency power and frequency supplied to the electrode 107 and the susceptor electrode 104.

Figure 2:
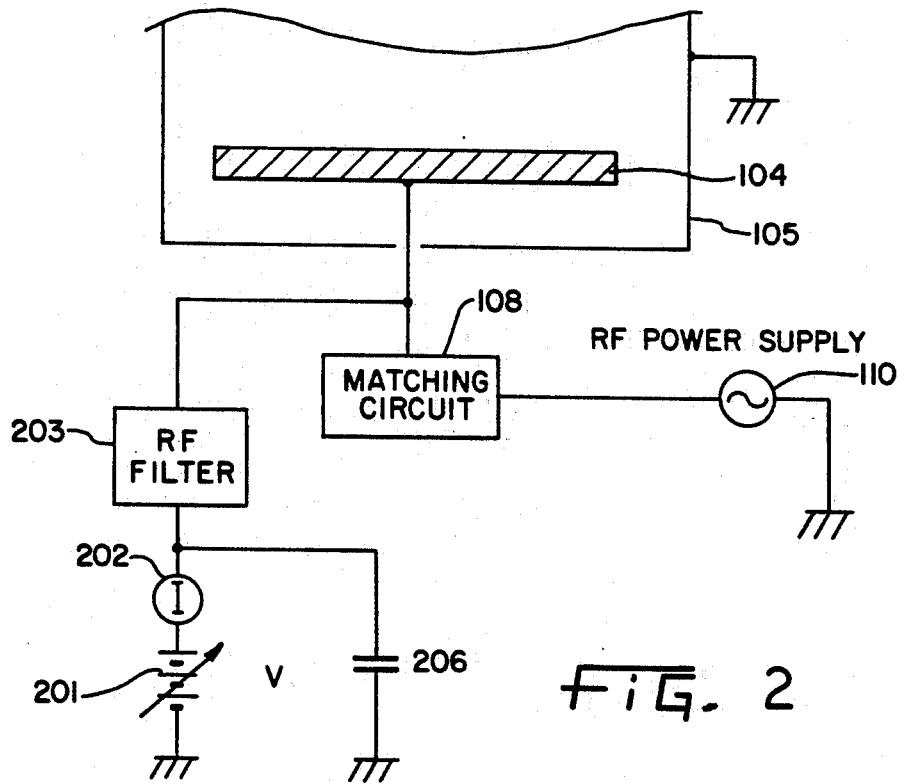
FIG. 2 is a schematic diagram of a device to measure current-voltage characteristics of the electrode.

FIG. 2 represents a circuit arrangement to measure current-voltage characteristics of the electrode 104 using the device of FIG. 1. In the high frequency filter 203 connected to electrode 104, impedance is high only at the high frequency $f_2$ supplied to the susceptor electrode 104 as the band eliminator 102b of FIG. 1 (b), and it is short-circuited in almost all cases to the frequencies which deviate from that frequency. DC power source 201 and ammeter 202 are connected in series to high frequency filter 203. A capacitor 206 is connected in parallel to the connections of high frequency filter 203 with ammeter 202 in order to short-circuit DC power source 201 and ammeter 202 in terms of high frequency.

Figure 3A:
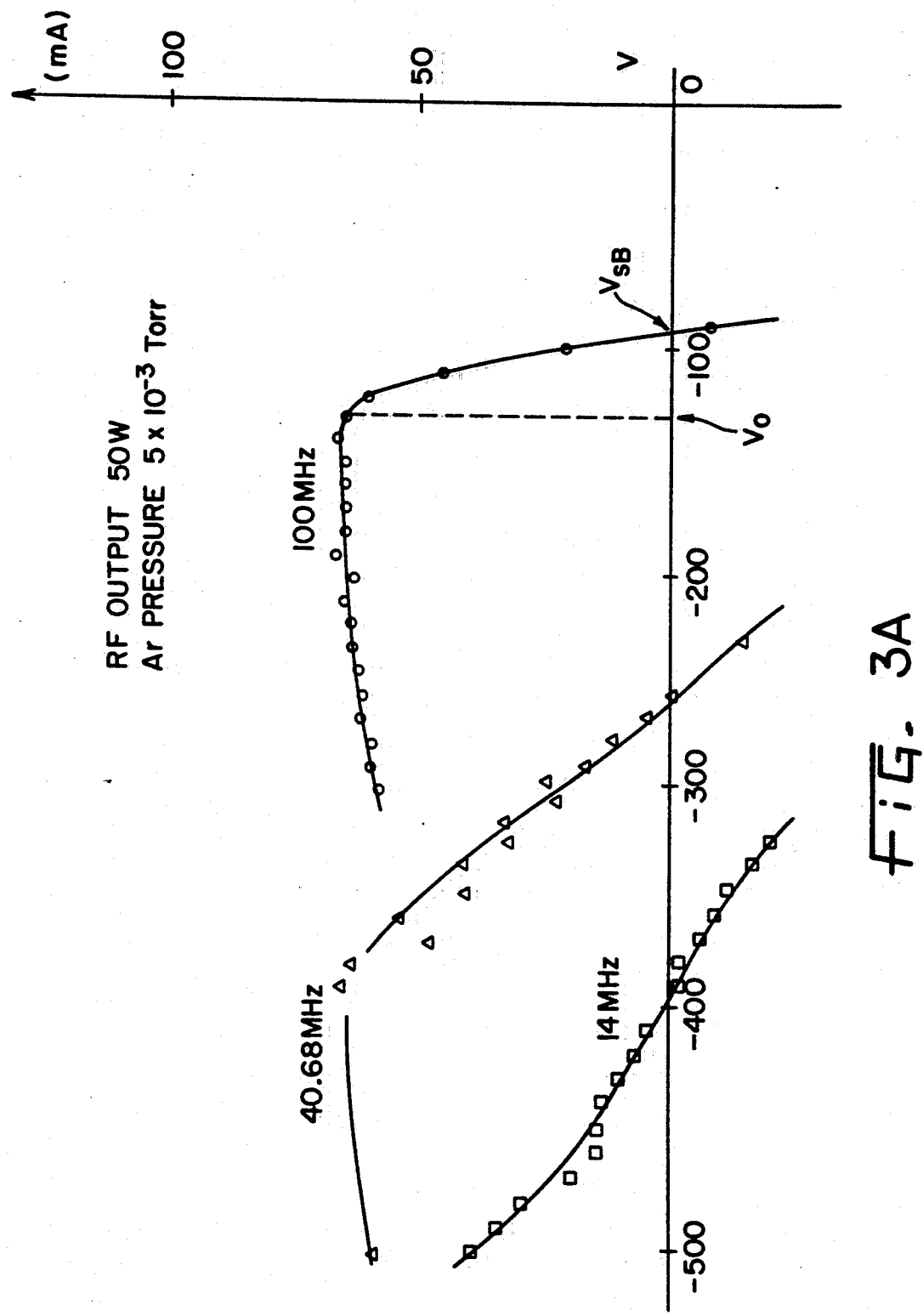
FIG. 3 (a) is a graph to show an experimental example of current-voltage characteristics of the electrode.
Figure 3B:
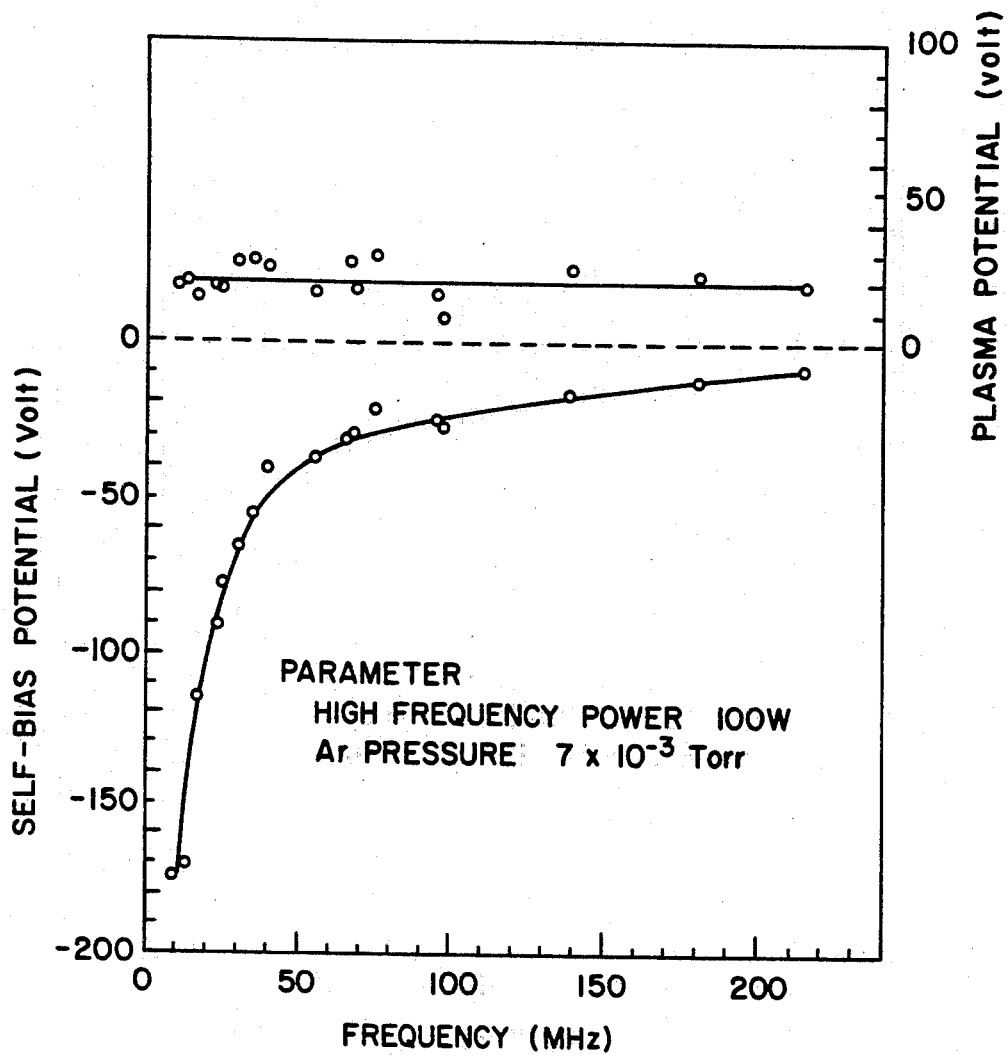

FIG. 3 (a) is a graphic representation of the relation between DC voltage V applied to electrode 104 and the resultant current when argon gas is introduced into vacuum container 105 by the pressure of $5 \times 10^{-3}$ Torr to induce discharge by high frequency power of 50 W under the above conditions. In this case, the frequency of high frequency power source 110 is made variable. For example, it is changed to 3 frequencies of 14 MHz, 40.68 MHz and 100 MHz. When the ions having positive electric charge flow to the electrode 104, the current takes positive value.

For example, in the characteristics of 100 MHz, when DC voltage V is about $-95$ V (This value is regarded as self-bias voltage $V_{SB}$.), DC current I=0. If $V > V_{SB}$, I<0, and if $V > V_{SB}$, I>0. The above self-bias voltage $V_{SB}$ is the DC bias voltage generated when a high frequency discharge occurs on the electrode 104 in floating state. In other words, when the electrode 104 is in this potential, the number ions flowing from the plasma to the electrode 104 is equal to the number of electrons. They offset each other, and the DC current is turned to 0.

On the other hand, when the potential of the electrode 104 is controlled by DC bias voltage applied from outside, current flows. For example, when the relation of $V > V_{SB}$ exists between the above DC voltage V and self-bias voltage $V_{SB}$, more electrons flow in, and I<0.

On the other hand, in case $V < V_{SB}$, the potential barrier against electrons becomes high and the number of the entering electrons is decreased. Thus, ion current increases more, and positive current flows. Further, when DC voltage V is increased in the negative direction, the current value is saturated when $V = V_0$ and reaches at almost constant value. This is equal to the current value with ions only.

These results reveal that the inclination of the I-V characteristics curve near $V = V_{SB}$ corresponds to the width of energy distribution of electrons. In other words, higher inclination means that the width of energy distribution of electrons is narrower. As is evident from FIG. 3 (a), energy distribution in case of 100 MHz is decreased to about 1/10 of that of 14 MHz. On the other hand, when the width of energy distribution of ions is $\Delta E_{ion}$ and the width of energy distribution of electrons is $\Delta E_e$, an approximately proportional relation exists between these two, and it is regarded that the width of energy distribution of ions is also decreased to about 1/10.

Although the value of $V_{SB}$ is the same high frequency power of 50 W, it is $-400$ V in case of 14 MHz and about $-95$ V in case of 100 MHz, decreasing to less than ¼ in absolute value. When power is decreased to 5 W in 100 MHz discharge, the value of $V_{SB}$ decreases to $-25$ V. That is, by controlled frequency and power, self-bias can be controlled in a wide range.

In the conventional RIE method, the underlying substrate is often damaged and the characteristics of the device are deteriorated. The reasons for this are as follows:

In the conventional cases, discharge was performed on the electrode 107 with low frequency of 13.56 MHz, and $|V_{sub}| = 400$ V $-600$ V, and the ions accelerated at this high voltage collided with the substrate.

However, in the embodiment of this invention, discharge is performed on the electrode 107 using a high frequency of 250 MHz, and $\Delta E_{ion}$ can be decreased to less than 1/20 compared with the conventional case of 13.56 MHz. In the device of this invention, discharge is maintained by high frequency power of $f_1$ applied on the electrode 107, and a high density plasma is generated. Also, the frequency supplied is $f_1$ (250 MHz), which is higher than the frequency $f_2$ supplied to susceptor electrode 104. Accordingly, the width of energy distribution of ions in a high density plasma is smaller. (There are fewer ions which have energy differing from the average energy value.) Further, as described later, the magnetic circuit is designed in such manner that the magnetic field strength in parallel to the electrode becomes as strong as possible. Thus, self-bias voltage is $-30$ V or less with high frequency power of 50 W, and plasma density is improved by about 10 times or more. According to FIG. 1 (e), high frequency power is 100 W, and self-bias is about $-10$ V with $f_1 = 210$ MHz. When $f_1 = 250$ MHz, self-bias is $-5$ V or less.

Because self-bias of the electrode 107 is as low as −5 V or less and the protective layer 101 is furnished, no sputtering occurs on the base material 102 of the electrode 107. Therefore, it is extremely easy to control the power and the frequency f₂ of the high frequency applied to susceptor electrode 104 to such value that the substrate is not damaged by self-bias. If the power of frequency f₁ is set to such value that the desired etching speed is obtained, the ions having high energy to give damage on the substrate surface are not irradiated. Thus, it is possible to perform etching at high speed and with high selectivity without damaging the thin film resist film or the underlying substrate.

Specifically, the higher the frequency of the high frequency power source is increased, or the more the high frequency power is decreased, the lower the self-bias voltage $V_{SB}$ becomes. Therefore, frequency and power should be selected and supplied to the susceptor electrode 104 in such manner that the ion energy and ion irradiation quantity necessary for high speed etching are obtained.

On the other hand, high frequency power of 250 MHz is applied on electrode 102, and small self-bias voltage is generated. Also, because protective layer 1010 is formed, the etching of base material 102 can be prevented. Further, a permanent magnet 106 is mounted in the embodiment of FIG. 1. As the result, magnetron discharge is induced near the electrode 107 (Electrons are wound on magnetic lines of force, and perform cyclotron movement, they receive energy from the high frequency electric field and efficiently ionize the molecules of the neutral excited activation seed source gas.) Thus, ion concentration is increased and higher etching speed can be achieved.

As described above, it is possible with the two-frequency excitation RIE device of this invention to perform etching of high quality thin film and substrate with a high selection ratio by maintaining high etching speed and without damaging the substrate.

Also, as shown in FIG. 2, by applying DC bias voltage to susceptor electrode 104, it is possible to control the energy of ions flowing to the susceptor electrode 104. This method, by which the potential of susceptor electrode 104 is controlled by applying a DC bias voltage and by which the surface potential of the substrate is controlled, is effective when the thin film or substrate (base substrate) is made of electrically conductive materials.

The above description has been given only for the case where the frequencies of the high frequency power supplied to the electrode 107 and the susceptor electrode 104 are set to 100 MHz and 250 MHz respectively. It is needless to say that the frequency selection is not limited to these values.

After all, in case of an RIE device, the first frequency f₁ supplied to the electrode 107 should be made higher than the second frequency f₂ supplied to the susceptor electrode 104. The actual values differ according to each purpose, and it should be determined according to the etching speed required or to the shape of the coating on the stepped portion of the formed film. Also, the material to be etched is not limited to insulating material, and conductive material may be used.

The magnet 106 placed on backside of the electrode 107 is not limited to the arrangement of FIG. 1. For example, FIG. 4 (a) shows the Embodiment 2 of this invention, in which a strong competition type magnet 409 is furnished and scanning is performed in order to increase uniformity of the magnetic field. In this case, it is convenient if the scanning system 410 of the magnet 409 is provided outside the vacuum container 105 because the contamination of the reaction system by dust from the mechanical operation can be prevented.

Further, the efficiency of RIE may be increased by also providing a magnet on the electrode 104 side of the susceptor. The magnet used here may be fixed as the magnet 106 in FIG. 1 or may be movable as the magnet 409 mounted on said scanning system 410.

To minimize damage to the substrate 103, it is possible to take the following method. For example, in case of etching of an insulating film such as $SiO_2$ formed on the surface of substrate 103 such as Si, etching is performed first at high speed by increasing RF power supplied on susceptor electrode 104 when the film up to several μm is being formed, and RF power is decreased immediately before the surface of the substrate 103 begins to be exposed. In so doing, etching is performed with a self-bias low enough after the substrate 103 begins to be exposed and the damage to the substrate surface can be almost completely eliminated.

If the kinetic energy of the ions irradiated on the surface of the substrate 103 is too big, the material is damaged whatever it may be. The material begins to be damaged when the kinetic energy of the irradiated ions is a little higher than the critical energy of the damage occurrence, which is determined in relation to the atom bonding power of each material. The atom bonding power in insulating material is generally higher than that of a semiconductor. The energy of the irradiated ions is preferably determined by taking the property of the substrate 103 and the insulating material into account.

Figure 4A:
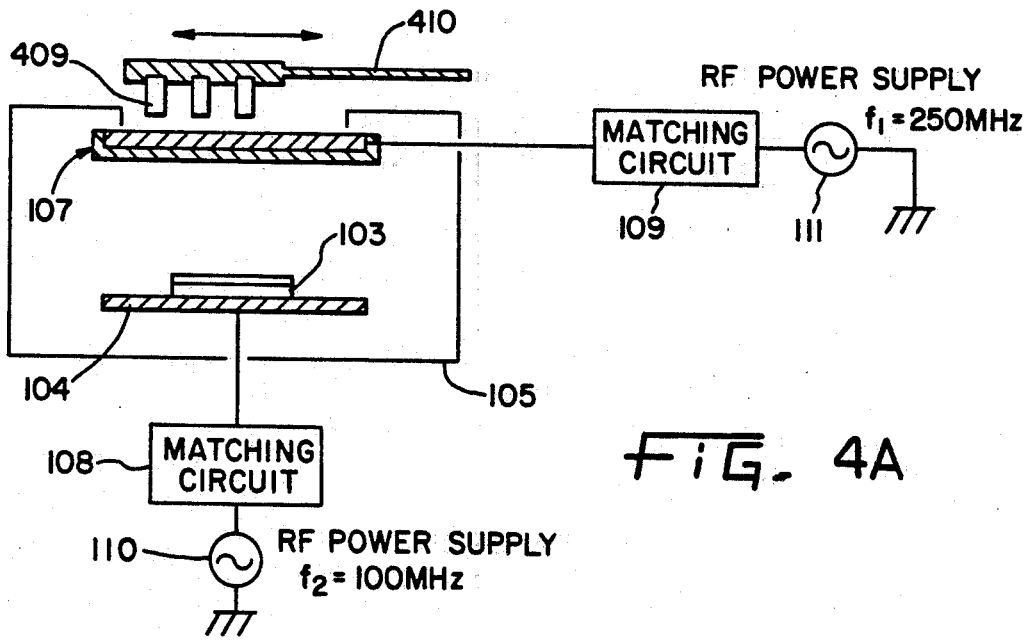
FIG. 4 (a) is a schematic diagram of embodiment 2.
Figure 4B:
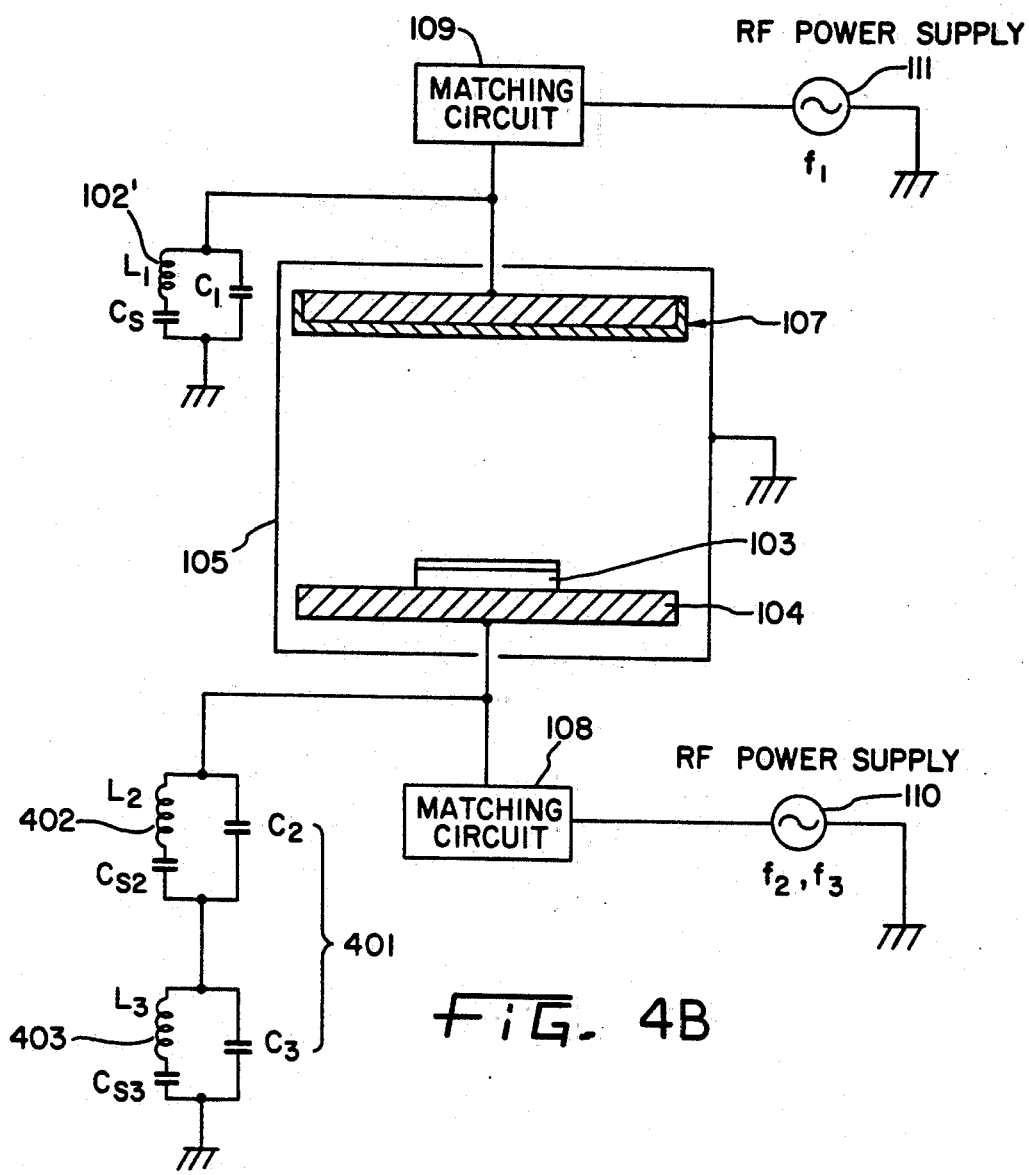
Figure 4C:
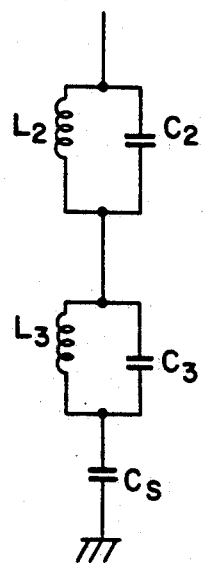
Figure 5:
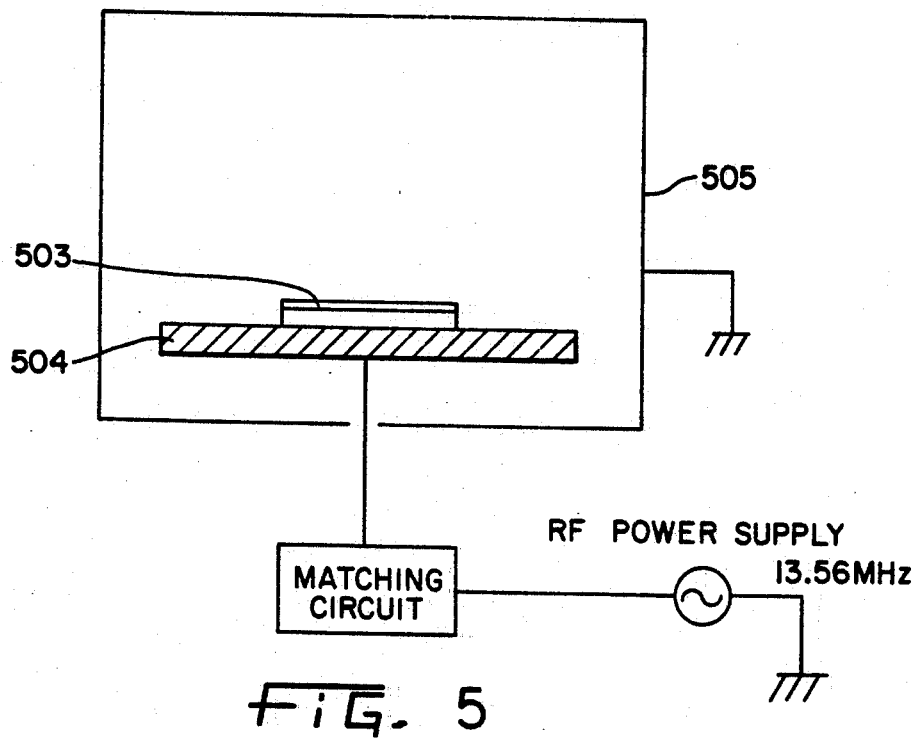
FIG. 5 is a schematic drawing showing the approximate arrangement of a conventional type device.

FIG. 4 (b) shows a third embodiment of the invention, in which the damage to the substrate 103 is eliminated and the energy of ions to be irradiated on the surface of the substrate 103 can be freely selected. The difference from the embodiment 1 of FIG. 1 (a) is that the two different frequencies f₂ and f₃ to be applied to the susceptor electrode 104 can be changed over, and the band eliminator 401 is also changed accordingly. 402 and 403 are resonance circuits of LC and have resonance frequencies of f₂ and f₃ respectively.

$$f_2 = 1/(2\pi \sqrt{L_2 C_2})$$

$$f_3 = 1/(2\pi \sqrt{L_3 C_3})$$

The band eliminator 401 with two resonance circuits 402 and 403 connected in series has higher impedance only to two frequencies f₂ and f₃, and it is short-circuited to the other frequencies. Accordingly, it has the function to supply power to susceptor electrode 104 selectively only to these two high frequencies.

For example, it is supposed that f₁ =250 MHz, f₂=100 MHz, and f₃ =40 MHz. When the high frequency applied to the susceptor electrode 104 is set to f₃ (40 MHz) when the film of 0.5-1 μm is being formed, self-bias is 0-100 V as shown in FIG. 1 (e), and a high etching effect is obtained. When the surface is about 100 Å, the frequency is changed to f₃ (100 MHz) and the thin film (e.g. 10-100 Å) is etched. As the result, the substrate is virtually not damaged because ions are irradiated on the substrate surface with smaller self-bias (about $-10$ V to $-20$ V) corresponding to 100 MHz when the substrate surface begins to be exposed.

Such method is particularly important in controlling the flatness of the surface of the thin film deposited by the RIE method. This is because the ion energy for the most effective etching can be controlled by changing the frequency and optimal energy value can be selected without damaging the substrate 103.

Here, the description has been given only on the case where two different frequencies of $f_2$ and $f_3$ are used, whereas it is needless to say that three values of $f_2$, $f_3$ and $f_4$ can be used. In this case, however, it is important to set the frequency $f_4$ to be applied first to $f_4$, $f_2$, $f_3$ and to use a higher frequency later in order to minimize the damage.

In case two or more frequencies are used, it is desirable that these frequencies $f_1$, $f_2$, $f_3$, . . . including the frequency $f_1$ for discharge excitation are selected in such manner that they are in the relation of higher harmonics. The discharge space is non-linear, and higher harmonics of $f_1$, $f_2$, $f_3$ . . . are included in entirely different form according to the discharge condition, and the setting of the condition becomes inaccurate.

The same effect can be obtained when the circuit of FIG. 4 (c) is used instead of the circuits 402 and 403 in FIG. 4 (b). However, it should be:

$$C_s >> C_2, C_3$$

in FIG. 4 (c).

Next, description is given on the concept of providing high performance characteristics to various processes performed by generating plasma between opposed parallel plate electrodes as described above.

The conditions necessary for providing high-performance discharge to the plasma process are as follows: (1) Not to damage the base substrate surface; (2) No contamination on the substrate surface by sputtering of chamber and electrode materials. There are of course other requirements for etching and high-performance film formation such as: High-speed etching and high speed film formation must be achievable; The plasma with the highest density should be obtained with the lowest high frequency power.

To satisfy the conditions (1) and (2), the potential of the plasma generated by discharge must be of such value that the chamber or electrode materials are not sputtered, i.e. it should be $+30$ V or less, or more preferably, $+20$ V or less. The chamber is normally used in grounded condition, while ion energy entering the surface in the chamber is about as high as the plasma potential. Normally, negative voltage is applied to the electrode 102 or the susceptor electrode 104, and ions with positive electric charge enter there, but the energy is controlled to the energy necessary for each purpose. In any case, it is essential that the plasma potential formed between opposed electrodes is suppressed within the range of $+5$ to $+20$ V. There is an optimal value for each ion energy irradiated on the substrate surface according to the purpose of etching or film formation. To adjust each ion energy to optimal value for each material, the self-bias (V) of the susceptor electrode is made to $V_{OP} = V_P + V_S$ by adjusting the high frequency power with frequency $f_2$ entering the susceptor electrode. This is because the energy of the ions irradiated on substrate surface is determined by the potential of the difference between the plasma potential and the substrate surface potential if ions do not collide between the plasma and the substrate surface.

Here, $V_{OP}$ is the optimal irradiation potential of the ions, $V_P$ is the plasma potential, and $-V_S$ is the self-bias of the susceptor electrode.

This design is not applicable if the potential of plasma formed between the opposed electrodes is not suppressed to low positive voltage. In other words, the relation $V_P < V_{OP}$ must exist. This is because the self-bias actualized by applying high frequency power to the susceptor electrode is always a negative voltage. Therefore, plasma potential $V_P$ must be set to a low positive voltage to satisfy the condition of $V_{SP} > V_{OP} > V_P$. Here $V_{SP}$ is the sputter starting voltage for chamber and electrode materials.

The above fact reveals that the key point for providing a plasma application device with high performance characteristics is to set the plasma potential to a low positive voltage ($V_{SP} > V_{OP} > V_P$). The reason for the high plasma potential at a positive voltage is that the electrons having lower negative electric charge than ions escape from the plasma space, and that ions with a positive charge are in excess and the plasma has positive charge. Therefore, to keep the plasma potential at a positive low potential, the necessary condition is not to release electrons from the plasma space as much as is practically possible. At the same time, it is important that discharge and ionization occur by high-frequency power as effectively as possible. Description is now given of the DC magnetic field distribution and a high-frequency electric field distribution to satisfy such conditions in connections with FIG. 6.

Figure 6A:
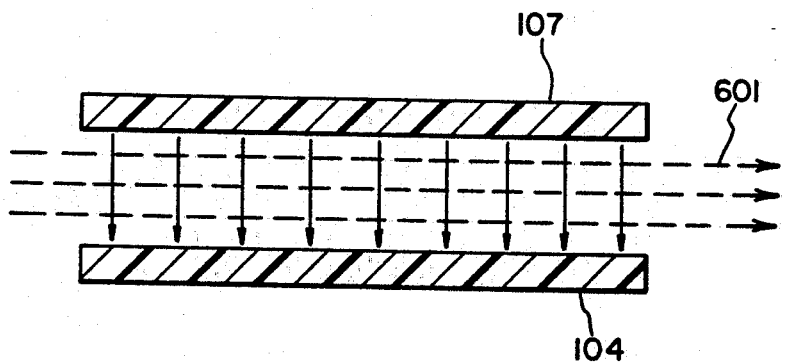
FIG. 6 $a+b$ shows the structure of parallel plate electrodes and the distribution of a high frequency electric field and a DC magnetic field.
Figure 6B:
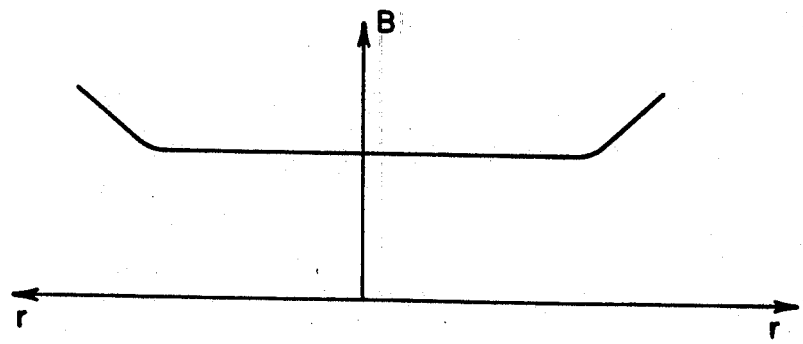

FIG. 6 (a) shows DC magnetic field distribution 601 (dotted line) to the opposed plate-like electrode 107 and susceptor electrode 104 and high frequency electric field distribution (solid line) 602.

An example in the ideal state is given in FIG. 6 (a). Namely, the DC magnetic field exists in parallel to the opposed electrode plates, and a vertical high-frequency electric field is present between the electrode plates. The electrons existing between the electrode plates are wound on the DC magnetic field and make circular movements (cyclotron movement). Because a high-frequency electric field exists in the direction of electrons making circular movement, energy is efficiently converted from electric field to electron movement. The electrons having energy are confined by making cyclotron movement between the electrode plates, and they efficiently collide with neutral molecules and atoms and ionize these molecules and atoms. On the electrode 107 and the susceptor electrode 104, self-bias is turned to negative voltage due to high-frequency input. Therefore, the electrons with negative charge do not enter two electrodes. The electrons flow out through the gap in parallel to two electrodes. To prevent the escape of electrons in lateral direction, it is necessary to distribute the strength of the DC magnetic field as shown in FIG. 6 (b). In other words, magnetic field strength is made stronger near the end of electrode plate. The strength of DC magnetic field is kept at constant level from the center of electrode plate and it is made stronger near the end of electrode plate. On the portion where the magnetic field strength becomes stronger, electrons are repulsed and are confined within a portion with constant magnetic field strength.

Figure 7:
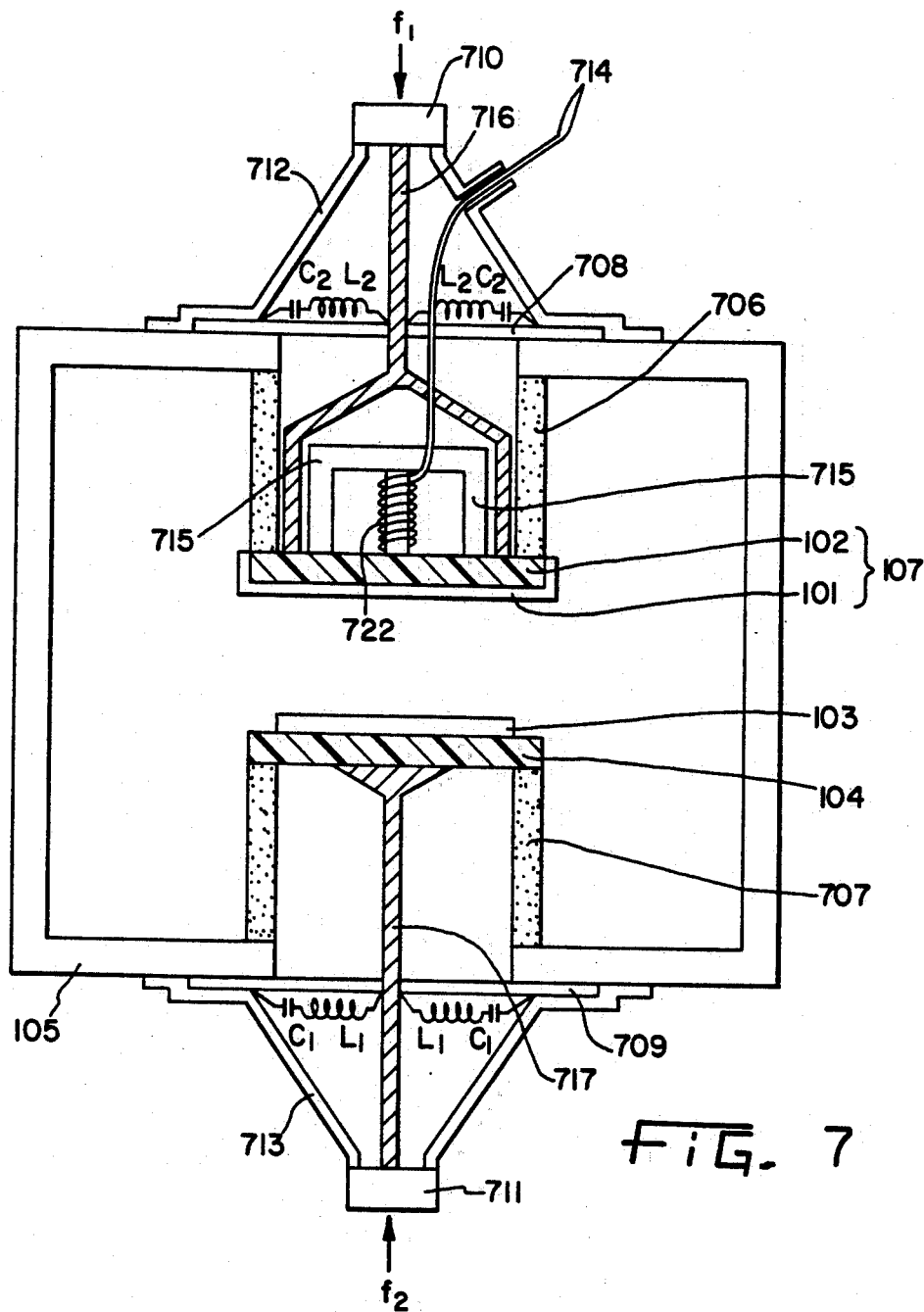
FIG. 7 is a cross-sectional view of the main portion of embodiment 4 of this invention.

Description is now given on an embodiment of the device, in which the concept of the present invention as shown in FIG. 6 is applied in connection with FIG. 7.

The same component as in FIG. 1 is referred by the same reference number. High frequency $f_1$ to excite discharge between electrodes is supplied through coaxial connector 710. 716 is an internal conductor to lead high-frequency power to the electrode 102, and 712 is an external conductor of coaxial table in tapered shape and is connected to the chamber 105 made of metal such as aluminum alloy, stainless steel, Ti, etc. In FIG. 1, DC magnetic field is supplied by permanent magnet 106 while it is supplied by electromagnets 714 and 715 in FIG. 7. 715 is a magnetic substance having magnetic permeability $\mu$ and high saturated magnetic flux density, and 714 is a cable to supply DC current. Because the electromagnet is completely enclosed by internal conductor 716 and the susceptor 102, it is not exposed to electric field and magnetic field of high frequency $f_1$ at all. High frequency power $f_2$ to control self-bias of susceptor electrode is supplied through the coaxial connector 711. 717 is an internal conductor of coaxial cable, and 713 is an external conductor. Serial circuits $L_1$ and $C_1$, and serial circuits of $L_2$ and $C_2$ are the circuits to short-circuit the high frequencies $f_1$ and $f_2$. 708 and 709 are teflon-impregnated insulating substrate for constituting these shorting circuits. The circuit to short-circuit the internal conductors 716 and 717 and external conductors 712 and 713 formed in conical form to suit a cylindrical coaxial arrangement. The examples are given in FIGS. 8 (a) and (b). A hole to penetrate the internal conductor is furnished at the center, and the shorting circuit is formed on Teflon-impregnated insulating substrate in disk shape. The above shorting circuits 1 and 2 are provided with holes 805 and 806 to receive internal conductors 716 and 717 at the center, and the substrate is formed in disk shape by Teflon-impregnated insulating material.

Figure 8A:
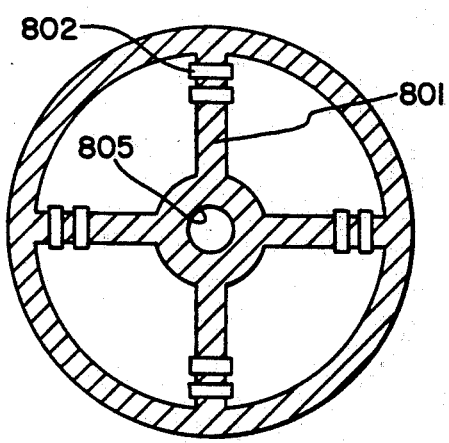
FIG. 8 $a+b$ is a circuit diagram of an example of a shorting circuit.
Figure 8B:
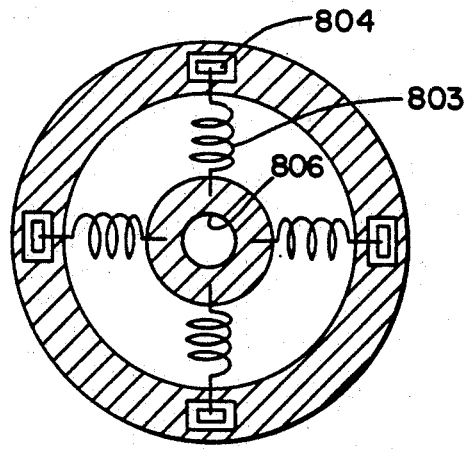
Figure 1E:
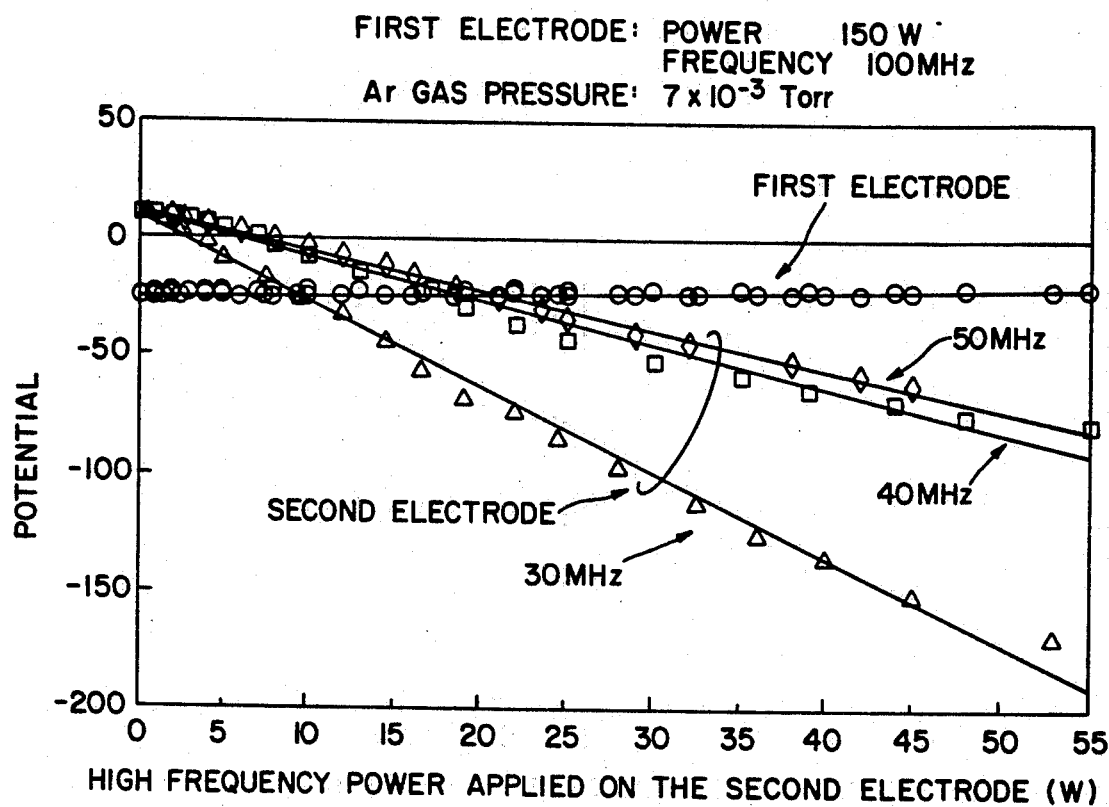

In FIG. 8, 4 serial resonance circuits are arranged at an angle of 90 degrees. 801 and 803 denote inductances, and 802 and 804 are high frequency capacitor such as laminated ceramics. The portion with diagonal lines is Cu thin film left on the insulating substrate. Normally, it is about 35-70 $\mu$m thick. The thickness of the insulating substrate depends upon high frequency power, and it is normally about 1-3 mm. In FIG. 8 (a), a straight line inductance is used, and the capacitor is a chip capacitor. In FIG. 8 (b), a coil with the predetermined number of windings is used, and the capacitor is a plate capacitor.

Returning now to FIG. 7, the electrode 102 and the susceptor 104 are made of insulating ceramics 706 and 707 in floating state from the chamber 105 in order that high frequency power, particularly the power of $f_1$ for inducing discharge between the electrodes, is efficiently confined between the electrodes. Compared with the gap between the electrodes, the distance from electrode to chamber is longer. This is because electric field of high frequency power $f_1$ entering the electrode 102 is terminated on the electrode 104. After termination on the electrode 104, the current of high frequency $f_1$ runs out to external conductor 712 through internal conductor 717, thus shorting circuits ($L_1$ and $C_1$) and the chamber 105.

The distance between the electrodes depends upon gas pressure and it is usually 2-10 cm. Because the area of electrode is bigger than that of the substrate 103, its diameter must be at least longer than 20 cm, 25 cm and 30 cm in case the wafer is 6 inches, 8 inches and 10 inches.

Figure 9:
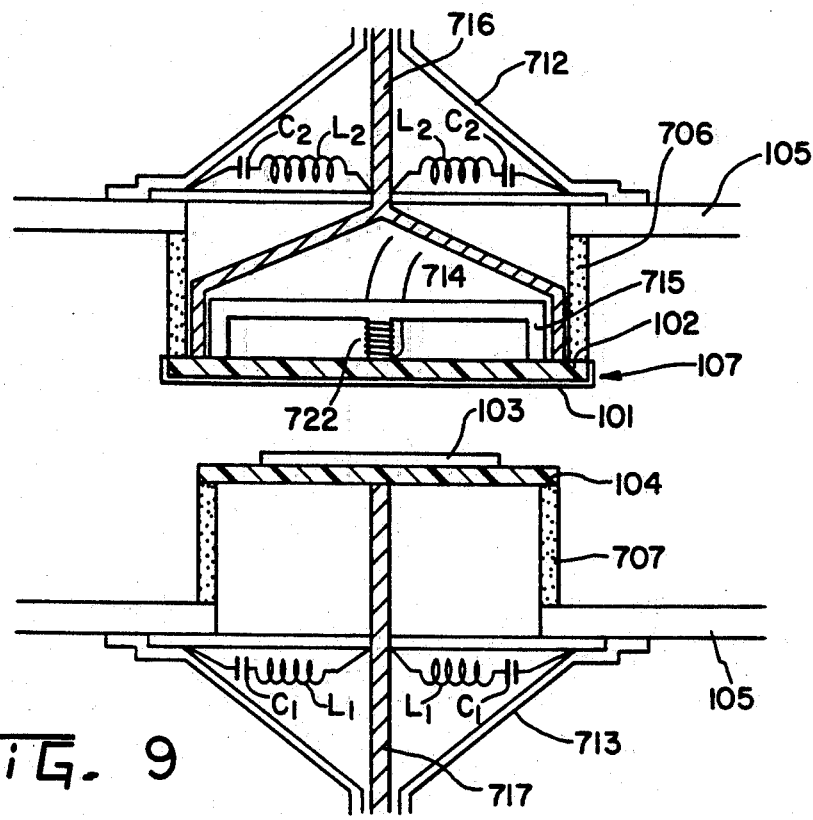
FIG. 9 is a cross-sectional view of embodiment 5 of the invention.

FIG. 9 shows embodiment 5, and this is relatively closer to an actual structure. In this embodiment, the gap between the electrodes 107 and 104 is narrower, and the high frequency electric field is almost entirely confined between the opposing electrodes.

Figure 10:
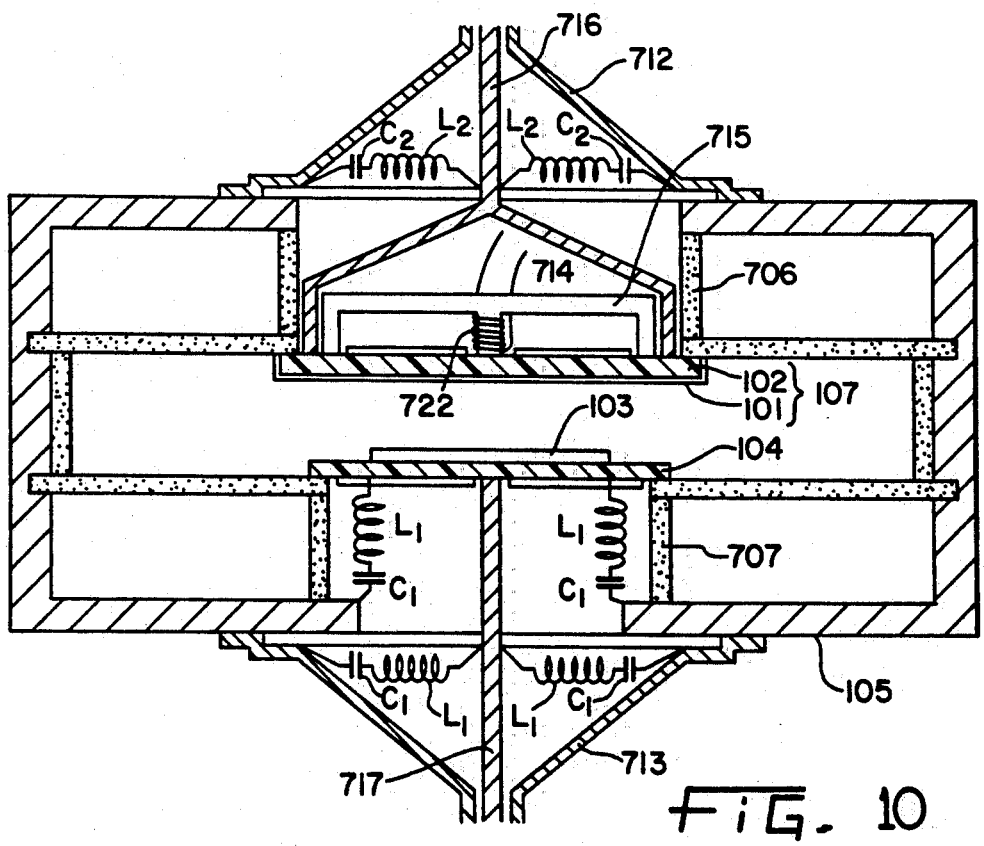
FIG. 10 is a cross-sectional view of embodiment 6 of the invention.

If the short-circuiting to high frequency power of the frequency $f_1$ supplied to the susceptor electrode 104 is not sufficient, it is preferable to furnish a shorting circuit directly between susceptor electrode 104 and vacuum container 105 as in embodiment 6 of FIG. 10. The key point of this embodiment lies in that as strong a magnetic field as possible is provided between the opposing two electrodes.

Figure 11:
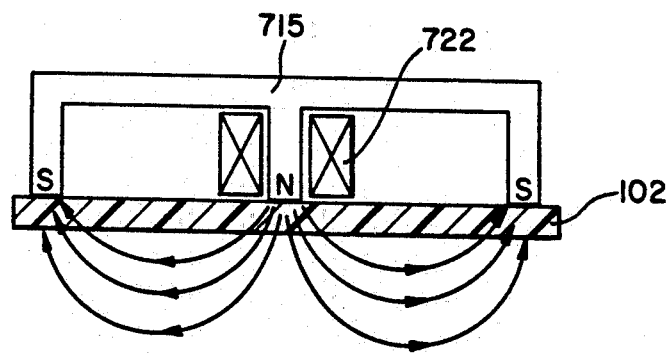
FIG. 11 shows magnetic field distribution (magnetic lines of force)

If an electromagnet made of coil 722 and magnetic material 715 is furnished as in the embodiments of FIG. 9 and FIG. 10, the magnetic line of force is distributed downward as shown in FIG. 11.

Figure 12:
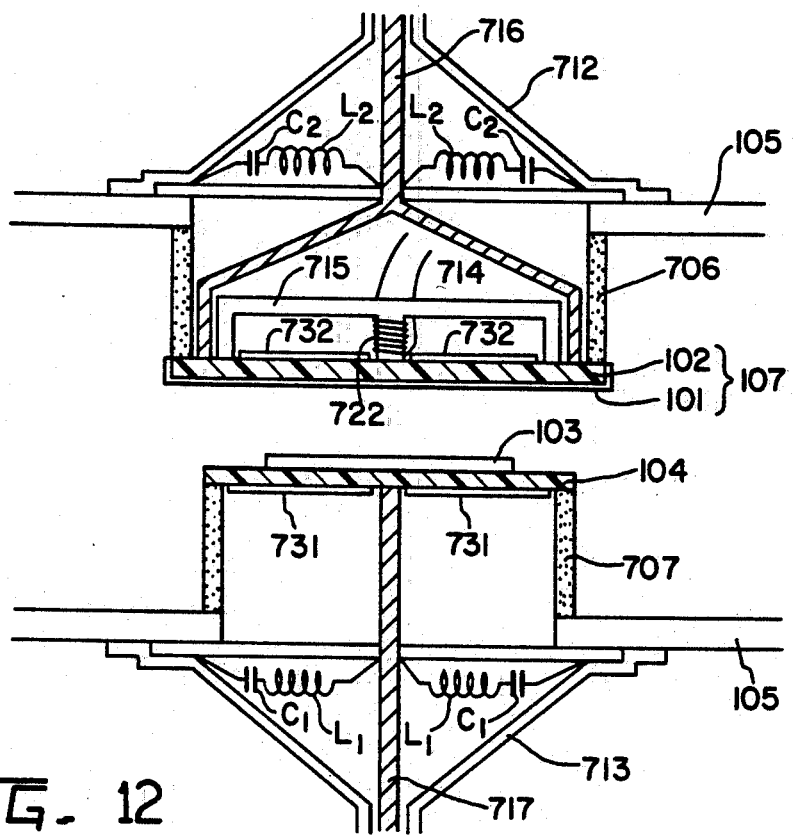
FIG. 12 is a cross-sectional view of the embodiment 7 of the invention.

If superconducting materials or superconducting thin films 731 and 732 showing perfect diamagnetic properties are furnished on backside of two electrodes 104 and 107 as given in embodiment 7 of FIG. 12, magnetic lines of force do not leak out of these superconducting materials 731 and 732 and it is present only between two electrodes.

Figure 13:
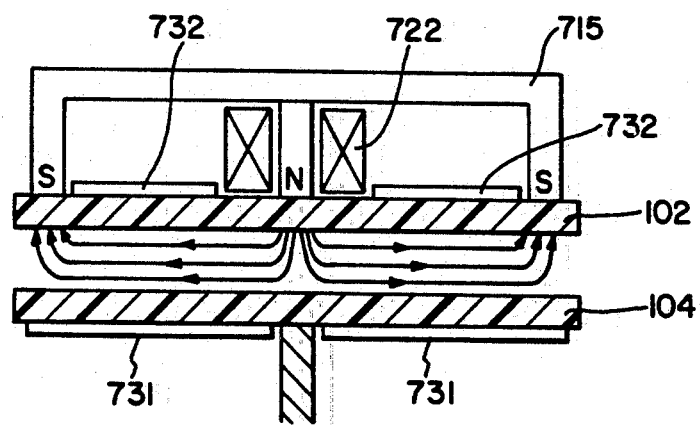
FIG. 13 shows the distribution of magnetic lines of force when superconducting thin film is provided on the backside of the electrode in the embodiment 8.

In case it is necessary to cool down the substrate 103, extremely high magnetic field confinement effects can be obtained by coating the oxide superconducting material, showing superconducting phenomena at liquid nitrogen temperature, by sputtering of 1 $\mu$m or more on backside of the electrode. Embodiment 8 of FIG. 13 represents an example of such magnetic confinement effect.

Figure 14:
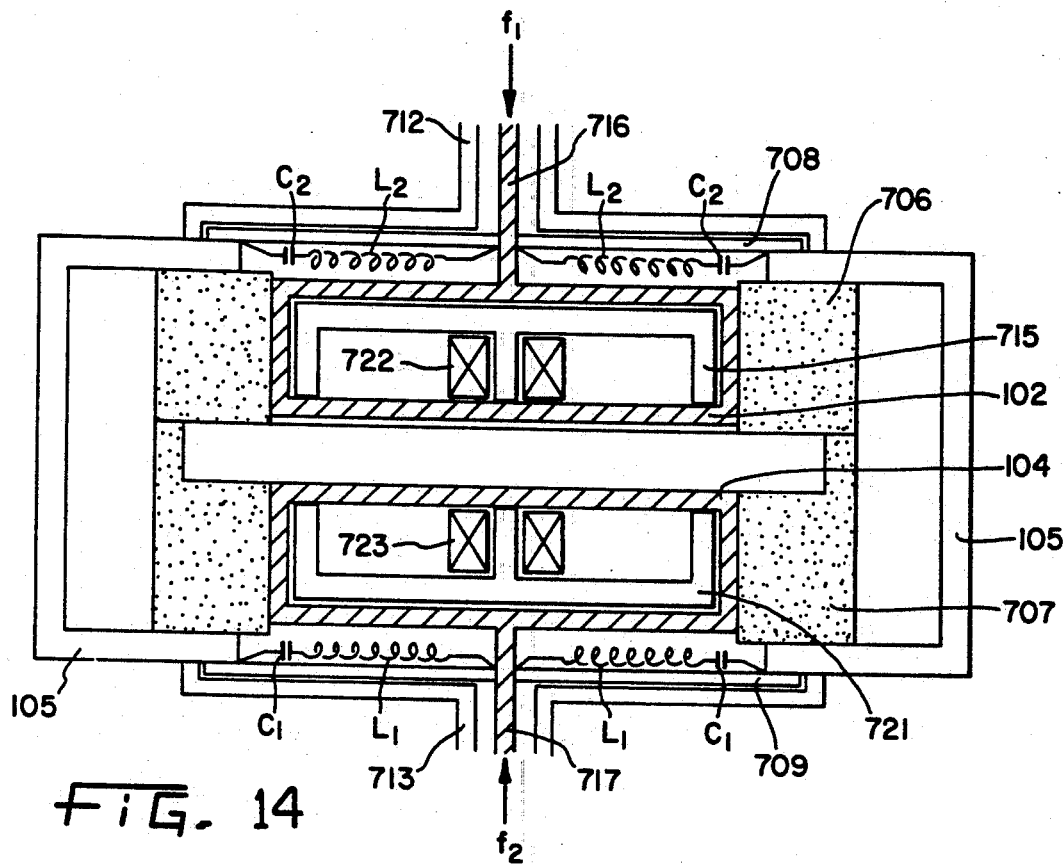
FIG. 14 is a cross-sectional view showing embodiment 9 of the invention.

Similarly, to generate a strong magnetic field in parallel direction by confining the magnetic field between two electrodes, electromagnets (721 and 723) should be furnished not only on the side of the electrode 102 but also on the side of susceptor electrode 104. This is shown in FIG. 14. The electromagnets (715 and 722) (721 and 723) are the internal conductors 716 and 717 for supplying high frequency power and are virtually enclosed. The cable to supply current to coils 722 and 723 is naturally pulled out by penetrating internal conductor. It is of course better to perform coating of superconducting material on the electrodes 102 and 104 in FIG. 14.

In embodiment 9, it is preferable that superconducting material of complete diamagnetic properties is coated on the electrodes 102 and 104. In this embodiment, the main unit 706 and 707 of vacuum container where discharge plasma is generated are formed by ceramics, and external container 105' is made of metal. The external container 105' plays a role for grounding and for passing high frequency current. When such arrangement is adopted, the discharge between the electrode 102 and the vacuum container, as seen in the devices of the embodiments of FIGS. 1, 9 and 10, is eliminated, and high frequency power is mostly confined between the electrodes 102 and 104. Thus, high density plasma can be generated between the electrodes with low high frequency power.

It is needless to say that the electromagnet enclosed by the internal conductors 716 and 717 can be formed by a permanent magnet. The material of the permanent magnet normally has low relative permeability of 4-5 or less.

Figure 15:
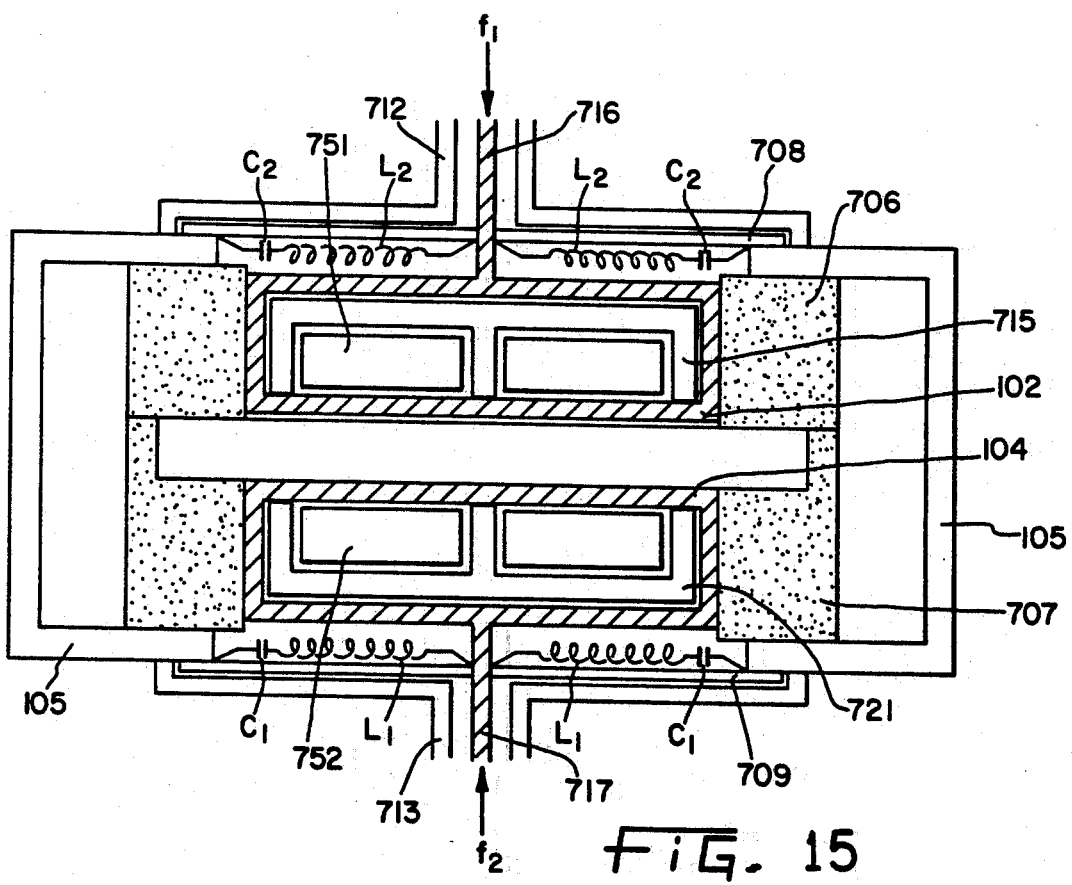
FIG. 15 is a cross-sectional view showing embodiment 10 of the invention.

Therefore, it is preferable in embodiment 9 of FIG. 14 to remove the coils 722 and 723 and to insert superconducting materials with perfect diamagnetic property in doughnut shape 751 and 752 as in the Embodiment 10 of FIG. 15. In this case, the magnetic materials 715 and 721, in which superconducting materials 751 and 752 are inserted, are made of permanent magnets.

In the above, description has been given on the reactive ion etching device, in which sputter contamination of chamber materials is completely eliminated and no damage occurs on substrate. The gases supplied into the chamber in this case depend upon the materials to be etched, and these gases are: chlorine type gases (such as $Cl_2$, $SiCl_4$, $CH_2Cl_2$, $CCl_4$, etc.), fluorine type gases (such as $F_2$, $CH_2F_2$, $CF_4$, $SiF_4$, etc.), mixed type gas (such as $CF_2Cl_2$), and carrier gas such as Ar and He, and additive gas $H_2$ and $O_2$ are added.

The wavelength of output frequency $f_1$ of the high frequency power source used for high frequency discharge must be at least more than twice as large as the diameter of the wafer in order to achieve uniform etching. Preferably, the frequency $f_1$ is about 100 MHz (wavelength: 3 m) –1 GHz (wavelength: 30 cm).

However, in case microwave such as 2.45 GHz is used, the wavelength of magnetic wave is smaller than wafer diameter and this is not desirable because it leads to the wide variation in the etching quantity.

In the above, the embodiments of this invention have been explained with regard to the etching of $SiO_2$ and Si film, whereas the invention is not limited to this. For example, the invention can be applied to the etching of PSG film, PBSG film, ASG film, silicon nitride film, $Al_2O_3$ film, AlN film, or the film or substrate made of Al, W, Mo, Ta, Ti or alloys of these materials.

The excited activation seed source gas can be properly selected according to the types of thin film to be etched For example $Cl_2$, $CCl_4$, $CCl_2F_2$, $Cl_2$, etc. in case of poly-Si thin film, $Cl_2$, $CCl_2F_2$, $CF_4$, etc. for Si thin film $CF_4/H_2$, $C_2F_6$, etc. for $SiO_2$ thin film, $CCl_4$, $SiCl_4$, $BCl_3$, $Cl_2$, etc. in case of aluminum thin film, and $F_2$, $Cl_2$, $CF_4$, etc. can be appropriately used in case of Mo thin, W thin film, Ti thin film, Ta thin film, etc. Also, it is effective to add $H_2$, $O_2$, $N_2$, as additive gas.

The substrate 103, on which these are formed, is not limited to insulating material, and conductive material or semiconductor may be used.

Further, this can be applied to the etching of macromolecular materials such as polyamide film, resist, etc. The substrate to be etched is also not limited to semiconductor wafer. The invention can also be applied to the sputter-etching in addition to reactive ion etching.

The device having the arrangement of each of the above embodiments can be easily applied not only for the above RIE, but also to PCVD, dry cleaning, resist ashing, dry development resist, etc. by partial modification.

First, in plasma CVD (PCVD), raw materials gas of $SiH_4$, $Si_2H_6$, $SiH_2$, $Cl_2$, etc. are supplied in case of Si film by adding the gas such as Ar, He, $H_2$, etc. The gas such as $H_2 + Al(CH_3)_3$, $H_2 + AlH(CH_3)_2$, etc. are used for Al film, the gases such as $SiH_4 + O_2$, $SiH_2Cl_2 + O_2$, etc. are used for Si $O_2$ film, and the gases such as $SiH_4 + NH_3 + H_2$, etc. are supplied in case of $Si_3N_4$ film. In the embodiments of FIGS. 1, 7, 9, 10, 12, 14 and 15, these raw material gases are discharged by high frequency power source $f_1$ and are turned to plasma. Thus, high density plasma is generated between the electrodes, but self-bias on the electrode 102 is as low as $-10$ to $-2$ V and the electrode is not sputtered because high frequency $f_1$ is maintained as high as 150 –250 MHz. Further, the energy of the ions irradiated on the substrate surface necessary for film making is controlled by high frequency power of the frequency $f_2$ (e.g. 10–80 MHz) lower than $f_1$. The energy of irradiated ions is controlled to optimal value required for film making by the power of $f_2$, and the density of irradiated ions is controlled by the power of $f_1$. For example, in case of Si film, when the gas supplied is (Ar $+SiH_4$), it is important to adjust the mixing ratio of Ar with $SiH_4$. Particularly, in order to form Si film with high quality at low temperature ranging from room temperature to 400° C., the activation of Si surface by ion irradiation is very important. For example, one or more irradiation ions having optimal energy are normally required until one Si atom reaches the standard grid position. For example, 10 ions or 50 ions are to be irradiated to one Si atom. Normally Ar quantity is set to higher value than $SiH_2$. The same applies to the case of other film. The ions to be irradiated on substrate surface need not be the atom or the molecule, which directly contributes to the film formation. It is better that the atoms and molecules contributing to the film formation are entirely different from the ions irradiated on substrate surface because ion irradiation quantity on substrate and film forming speed can be independently controlled to form the film of high quality.

On the other hand, resist is detached normally by a wet process using mixture solution ($H_2SO_4 + H_2O_2$), while the resist after ion injection process is not dissolved in mixture solution. For this reason, it is removed by strong oxidizing reaction in the oxygen ($O_2$) plasma.

However, in the conventional type devices, there are the problems of the damage by high energy ion irradiation or metal contamination of substrate surface by sputtering of chamber inner surface, and this eliminates the effect of resist detachment.

If the device of this invention (as shown in FIGS. 1, 7, 9, 10, 12, 14 and 15) is applied, oxygen plasma can be completely controlled and resist detachment can be accomplished without damage and metal contamination. If a small quantity of $Cl_2$ is added in the resist, metal components are also removed at the same time. When resist is detached, Si surface is slightly oxidized by oxygen plasma, while this thin oxide film can be easily removed by vapor phase etching, mixing HF gas of about 0.6% in N, and Ar. When oxide film is removed, Si surface is terminated by fluorine, and this fluorine can be easily removed by (Ar $+H_2$) plasma accelerated to about 2-10 eV.

Next, description is given to dry cleaning. The contamination with organic materials can be cleaned up by $O_2$ ions or $O_3$ accelerated to 1-15 eV. Thin oxide film ($SiO_2$) formed on the surface of bare silicon can be removed by HF gas of 0.5–0.6% contained in $N_2$ and Ar. Metal components can be removed by $Cl_2$ ions accelerated to 1-15 eV. Thus, the device of this invention can be applied to full extent.

The device for plasma process according to the present invention is to process the object in the plasma generated in a container, in which pressure can be reduced, and it is characterized in that there are provided at least a first and a second electrodes placed at opposing position in said container and are formed in plate-like shape, a protective member made of the materials stable to the plasma and covering said first electrode, holding means for mounting the object on the second electrode, a first high frequency power connected to the first electrode, a second high frequency power source connected to the second electrode, and gas supply means for introducing the gas as desired into the container, and that the frequency of the first high frequency power source is higher than the frequency of said second high frequency power source. By this device, it is possible to perform various plasma processes such as RIE, plasma chemical vapor deposition, resist asher, dry cleaning, etc. without damaging or contaminating the base substrate of the object to be processed and without contaminating the atmosphere for the processing.

Also, the invention can be applied to the device of various plasma processed without modifying basic components and structure and by simply changing the specifications slightly such as specific setting conditions, e.g. the value of output frequency of high frequency power source, or type of the gas to be introduced. Thus, it is possible to standardize the devices and to attain the coordinated and consistent operation for the manufacture of semiconductor equipment.

Further, because each of these devices has common components, manufacture, control and maintenance of these components can be easily performed, and this contributes to provide the device with high performance characteristics.

A partial list of various parts and numerals therefor shown in the drawings is as follows:

101 . . . Protective layer (protective member)
102 . . . Base material
103 . . . Substrate (object to be processed)
104 . . . Susceptor electrode (the second electrode)
105 . . . Vacuum container
107 . . . Electrode (the first electrode)
110 . . . The second high frequency power source
111 . . . The first high frequency power source While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A plasma process device for generating plasma in a container under reduced pressure and for processing an object to be processed, said device usable for various plasma processes, said device comprising:
   at least a first and a second electrode placed at opposing positions in said container, said first and second electrodes being generally planar, a protective member made of a material stable to said plasma and covering said first electrode, holding means for mounting the object to be processed on said second electrode, a first high frequency power source connected to said first electrode for producing a first high frequency, a second high frequency power source connected to said second electrode for producing a second high frequency, and gas supplying means for introducing a desired gas into said container, said first high frequency higher than said second high frequency.

2. A method for generating plasma in a container under reduced pressure and for processing an object to be processed, said method comprising the steps of:
   providing at least a first and a second electrode placed at opposing positions in said container and formed in plate-like shape;
   providing a protective member made of a material stable to said plasma and covering said first electrode;
   providing means for holding the object to be processed on said second electrode;
   providing a first high frequency power source connected to said first electrode for producing a first high frequency;
   providing a second high frequency power source connected to said second electrode for producing a second high frequency, said first high frequency higher than said second high frequency; and
   providing means for introducing the desired gas into said container;
   whereby said device may be used for various plasma processes.

3. The method of claim 2 wherein said various plasma processes comprise reactive ion etching, plasma chemical vapor deposition, resist asher, and dry cleaning.

* * * * *